(12) United States Patent
Kim et al.

(10) Patent No.: US 12,364,108 B2
(45) Date of Patent: Jul. 15, 2025

(54) DISPLAY DEVICE AND METHOD OF MANUFACTURING THE SAME

(71) Applicant: Samsung Display Co., LTD., Yongin-si (KR)

(72) Inventors: Inok Kim, Osan-si (KR); Sanghun Lee, Hwaseong-si (KR); Chansu Kim, Asan-si (KR); Keunchan Oh, Hwaseong-si (KR); Gak Seok Lee, Hwaseong-si (KR); Soyun Lee, Seoul (KR); Jieun Jang, Suwon-si (KR); Chang-Soon Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 478 days.

(21) Appl. No.: 17/743,376

(22) Filed: May 12, 2022

(65) Prior Publication Data

US 2023/0060722 A1    Mar. 2, 2023

(30) Foreign Application Priority Data

Aug. 30, 2021   (KR) .................. 10-2021-0114676

(51) Int. Cl.
*H10K 59/122*  (2023.01)
*H10K 59/38*   (2023.01)
*H10K 59/80*   (2023.01)
*H10K 59/12*   (2023.01)

(52) U.S. Cl.
CPC ......... *H10K 59/122* (2023.02); *H10K 59/873* (2023.02); *H10K 59/8731* (2023.02); *H10K 59/1201* (2023.02); *H10K 59/38* (2023.02)

(58) Field of Classification Search
CPC .. H10K 59/122; H10K 59/1201; H10K 59/38; H10K 59/873; H10K 59/8731
See application file for complete search history.

(56) References Cited

U.S. PATENT DOCUMENTS

| | | | |
|---|---|---|---|
| 2016/0064686 A1* | 3/2016 | Odaka ............... | H10K 59/8722 257/89 |
| 2017/0186830 A1* | 6/2017 | Tokuda ............... | H10K 50/865 |
| 2018/0182818 A1 | 6/2018 | Kim | |
| 2022/0344406 A1* | 10/2022 | Kim .................... | H01L 25/0753 |

FOREIGN PATENT DOCUMENTS

KR   10-2020-0032294      3/2020

* cited by examiner

*Primary Examiner* — Jeff W Natalini
*Assistant Examiner* — Brandon C Fox
(74) *Attorney, Agent, or Firm* — Womble Bond Dickinson (US) LLP

(57) ABSTRACT

A display device may include a transistor substrate including a driving element, and having a display area, and a non-display area surrounding the display area, a bank layer on the non-display area of the transistor substrate, and exposing an outer area of the non-display area of the transistor substrate that is opposite to the display area, an inorganic insulating layer covering an upper surface of the bank layer, a side surface of the bank layer, and the outer area of the transistor substrate, a low refractive layer on the inorganic insulating layer, and a first color filter layer on the non-display area to cover a portion of an upper surface of the inorganic insulating layer, and a side surface of the inorganic insulating layer.

20 Claims, 16 Drawing Sheets

FIG. 12
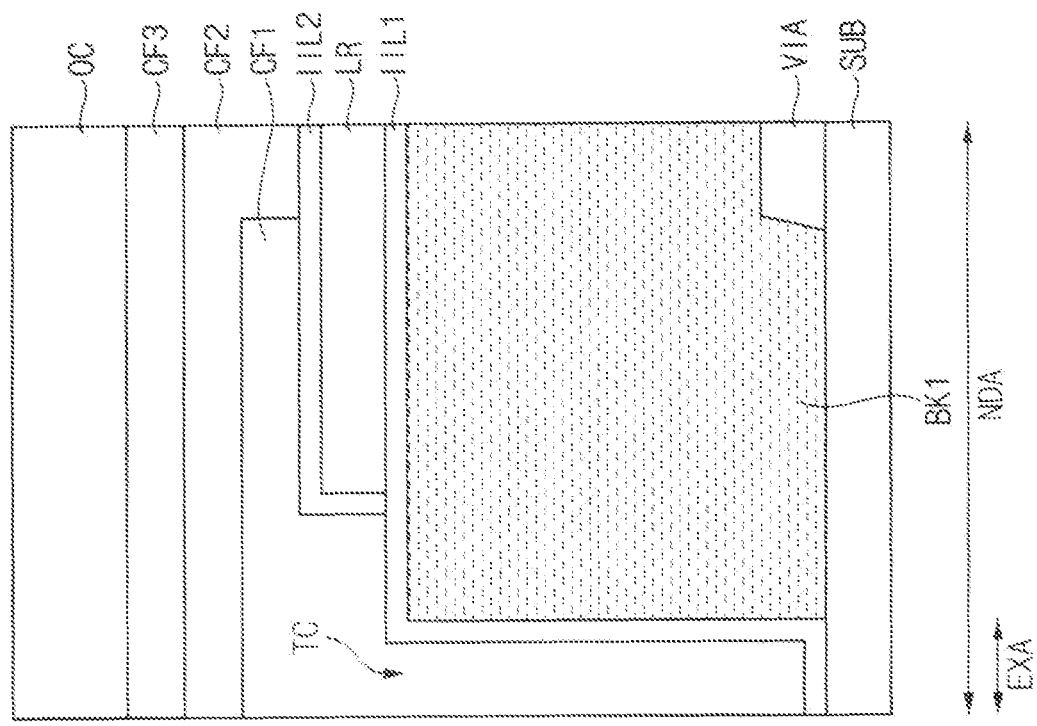
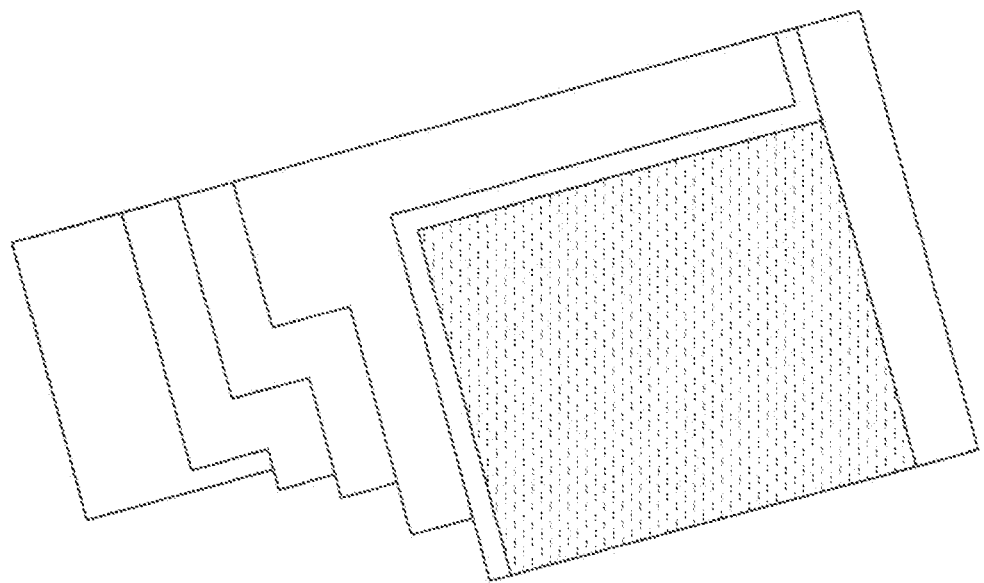

DISPLAY DEVICE AND METHOD OF MANUFACTURING THE SAME

CROSS-REFERENCE TO RELATED APPLICATION

This application claims priority to, and the benefit of, Korean Patent Application No. 10-2021-0114676, filed on Aug. 30, 2021, the content of which in its entirety is herein incorporated by reference.

BACKGROUND

1. Field

Embodiments relate to a display device capable of displaying an image, and a method of manufacturing the display device.

2. Description of the Related Art

A display device is manufactured and used in various ways. The display device may display light to provide visual information to the user. Such a display device may include a liquid crystal display device that emits light using a liquid crystal layer, an inorganic light emitting display device that emits light using an inorganic light emitting material, and an organic light emitting display device that emits light using an organic light emitting material.

Light emitting materials may be sensitive to moisture or heat. Accordingly, a sealing member may be located on an outer portion of the display device to protect the light emitting materials. The sealing member may reduce or prevent moisture or heat penetrating into the display device and, at the same time, may serve to protect the display device from external impact.

SUMMARY

Embodiments may provide a display device with improved durability.

Embodiments may provide a method of manufacturing a display device with improved durability.

Some embodiments of a display device may include a transistor substrate including a driving element, and having a display area, and a non-display area surrounding the display area, a bank layer on the non-display area of the transistor substrate, and exposing an outer area of the non-display area of the transistor substrate that is opposite to the display area, an inorganic insulating layer covering an upper surface of the bank layer, a side surface of the bank layer, and the outer area of the transistor substrate, a low refractive layer on the inorganic insulating layer, and a first color filter layer on the non-display area to cover a portion of an upper surface of the inorganic insulating layer, and a side surface of the inorganic insulating layer.

The first color filter layer may seal the bank layer, wherein a side surface of the first color filter layer is exposed to an outside.

The display device may further include a second color filter layer on the first color filter layer on the non-display area.

The display device may further include a third color filter layer on the second color filter layer on the non-display area.

The first color filter layer may seal the bank layer, and side surfaces of the first to third color filter layers are exposed to an outside.

The inorganic insulating layer may cover the outer area of the transistor substrate.

The low refractive layer may overlap the bank layer on the upper surface of the inorganic insulating layer.

The display device may further include a light emitting element on and connected to the driving element.

The display device may further include a color converting layer on the light emitting element to overlap the light emitting element, a second color filter layer on the color converting layer, and a third color filter layer on the first color filter layer, wherein the second color filter layer is a same as one of the first or third color filter layers.

Some embodiments of a display device may include a transistor substrate including a driving element, and having a display area, and a non-display area surrounding the display area, a bank layer on the non-display area of the transistor substrate, and exposing an outer area of the non-display area of the transistor substrate that is opposite to the display area, and a first color filter layer on the outer area of the transistor substrate, sealing the bank layer, and having a side surface exposed to an outside.

The display device may further include a second color filter layer on the first color filter layer, and a third color filter layer on the second color filter layer.

The display device may further include a light emitting element on and connected to the driving element.

The display device may further include a color converting layer overlapping the light emitting element, and a fourth color filter layer on the color converting layer, wherein the fourth color filter layer is a same as one of the first, second, or third color filter layers.

The first color filter layer may overlap an upper surface of the bank layer.

The display device may further include an inorganic insulating layer between the first color filter layer and the bank layer.

Some embodiments of a method of manufacturing a display device may include forming a first bank layer on a non-display area of a transistor substrate including a driving element, and having a display area, and the non-display area surrounding the display area, removing a portion of the first bank layer to form a second bank layer spaced apart from the display area and to define a trench, forming a first inorganic insulating layer on the first bank layer, on the second bank layer, and on portions of the first bank layer and the second bank layer defining the trench, forming a low refractive layer on the first inorganic insulating layer to overlap at least a portion of the first bank layer, forming a first color filter layer on the first inorganic insulating layer and filling the trench, and cutting between the first bank layer and the second bank layer.

The method may further include forming a second color filter layer on the first color filter layer, and forming a third color filter layer on the second color filter layer.

The method may further include locating a light emitting element on and connected to the driving element.

The method may further include locating a color converting layer on the light emitting element to overlap the light emitting element, locating a second color filter layer on the color converting layer, and locating a third color filter layer above the first color filter layer, wherein the second color filter layer is deposited concurrently with one of the first or third color filter layers.

The first color filter layer may be exposed to an outside.

Accordingly, in the display device, the color filter layer may reduce or prevent external moisture or heat penetrating into the display device, and may protect the outer area of the display device from external impact of the color filter layer.

BRIEF DESCRIPTION OF THE DRAWINGS

Illustrative, non-limiting embodiments will be more clearly understood from the following detailed description taken in conjunction with the accompanying drawings.

FIGS. 4 to 13 are views illustrating a method of manufacturing the display device of FIG. 1.

DETAILED DESCRIPTION

Figure 1:
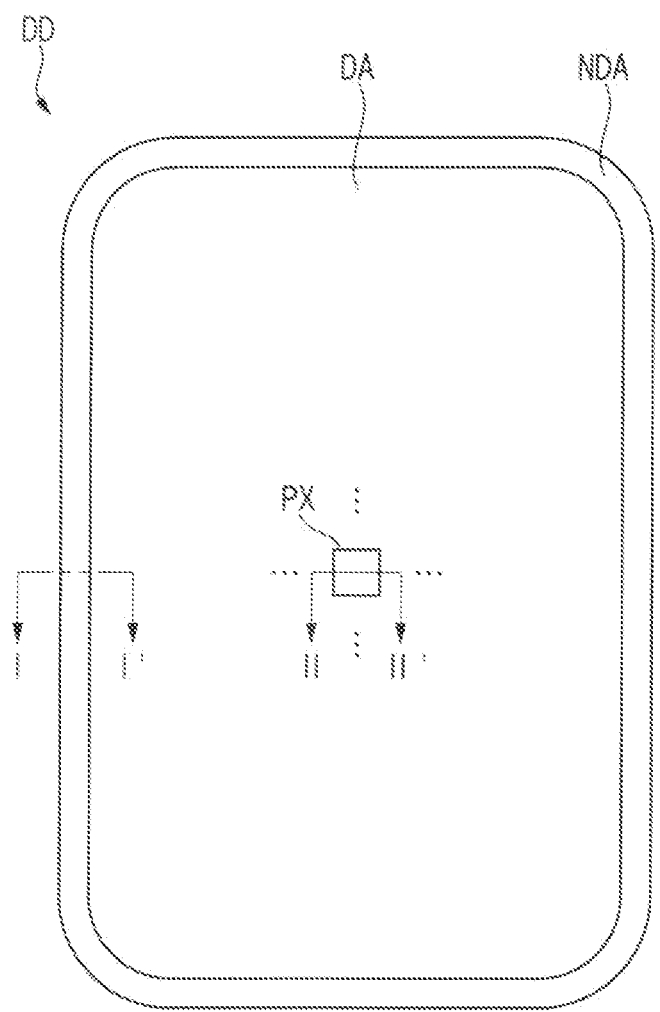
FIG. 1 is a plan view illustrating a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to some embodiments.

Referring to FIG. 1, a display device DD may include a display area DA and a non-display area NDA. The non-display area NDA may be located to surround the display area DA. However, in some embodiments, the non-display area NDA may be located only on at least one side of the display area DA.

A plurality of pixels PX may be located in the display area DA. The plurality of pixels PX may include a driving element, and a light emitting element connected to the driving element. The display device DD may display an image by emitting light from the plurality of pixels PX. To this end, the plurality of pixels PX may be generally located in the display area DA. For example, the plurality of pixels PX may be arranged in a matrix form in the display area DA.

Drivers for driving the plurality of pixels PX may be located in the non-display area NDA. The drivers may include a data driver, a gate driver, a light emitting driver, a power voltage generator, a timing controller and the like. The plurality of pixels PX may emit light based on signals received from the drivers.

Figure 2A:
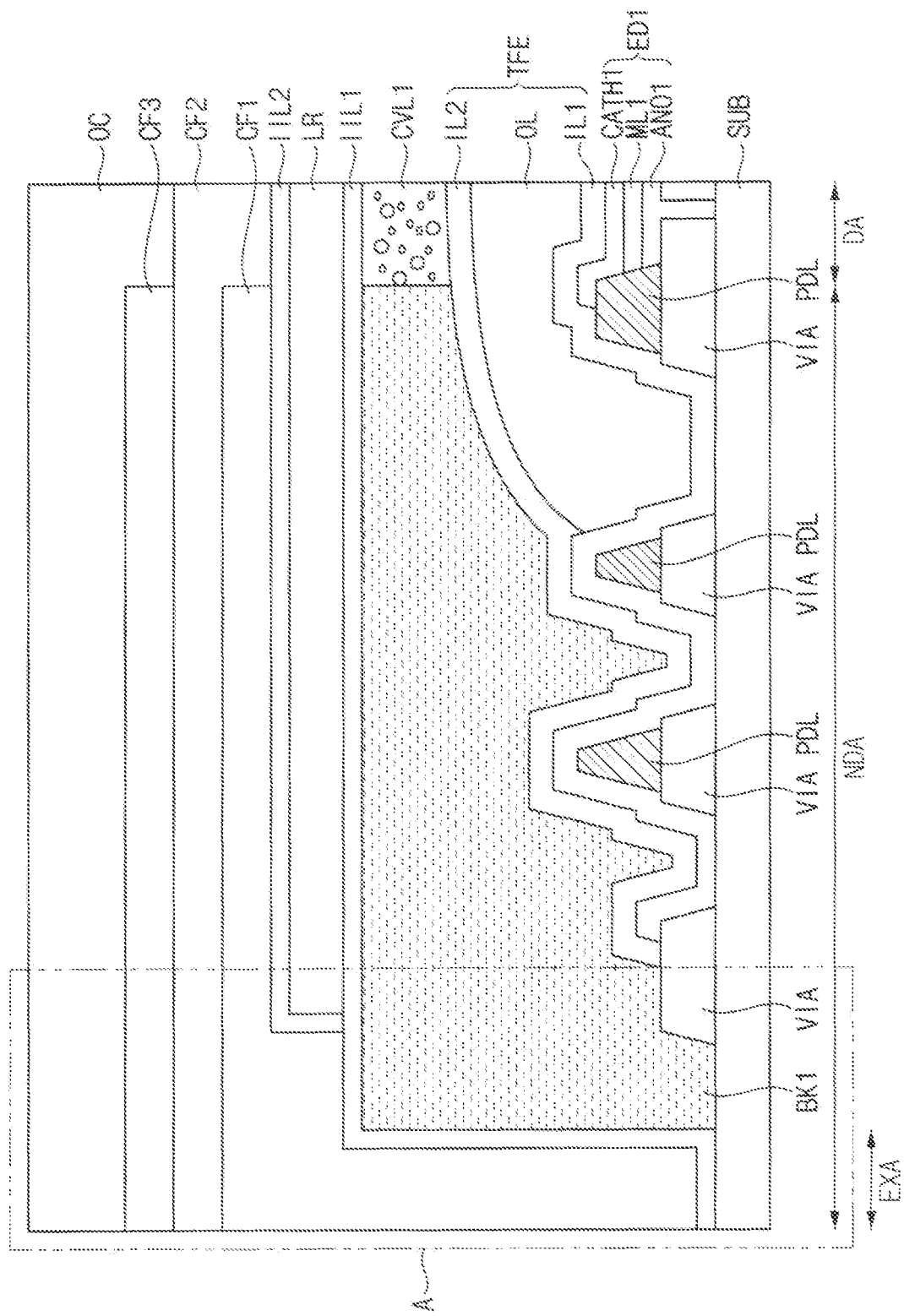
FIGS. 2A and 2B are cross-sectional views illustrating some embodiments taken along the line I-I' of FIG. 1.
Figure 2B:
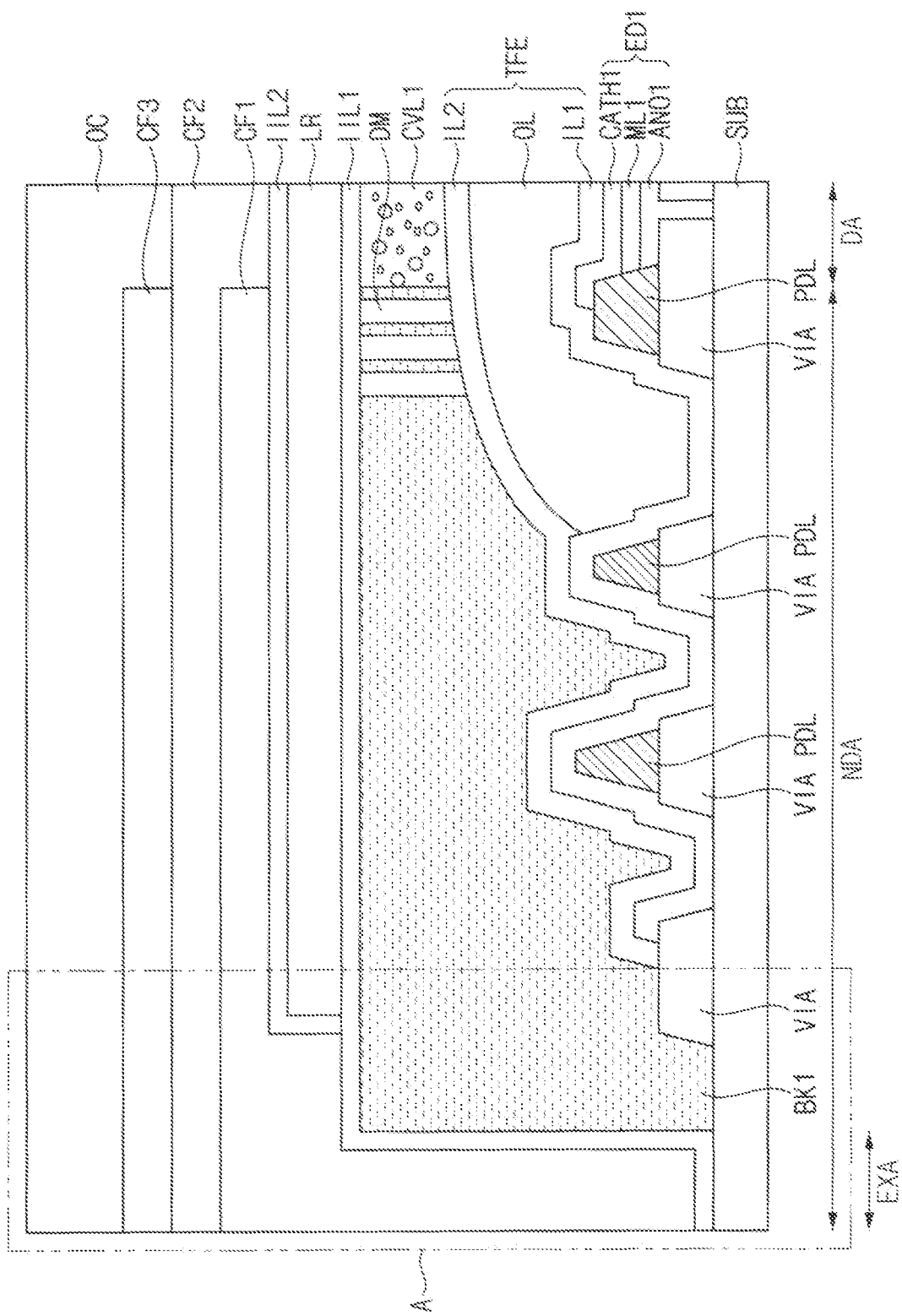

FIGS. 2A and 2B are cross-sectional views illustrating some embodiments taken along the line I-I' of FIG. 1.

Referring to FIGS. 1 and 2A, The display device DD may include a transistor substrate SUB, a via insulating layer VIA, a first light emitting element ED1, a pixel defining layer PDL, an encapsulation layer, a first color converting layer CVL1, a first bank layer BK1, a first inorganic insulating layer IIL1, a low refractive layer LR, a second inorganic insulating layer IIL2, a first color filter layer CF1, a second color filter layer CF2, a third color filter layer CF3, and an overcoat layer OC.

The first light emitting element ED1 may include a first anode electrode ANO1, a first intermediate layer ML1, and a first cathode electrode CATH1. The encapsulation layer may include a first inorganic encapsulation layer IL1, an organic encapsulation layer OL, and a second inorganic encapsulation layer IL2.

The transistor substrate SUB may include a base substrate, and driving elements located on the base substrate. The base substrate may include a flexible material or a rigid material.

A via insulating layer VIA may be located on the transistor substrate SUB. The via insulating layer VIA may have a flat top surface to be flatly located with (e.g., below, or coplanar with, a bottom surface of) the first light emitting element ED1. The via insulating layer VIA may include an organic insulating material. The via insulating layer VIA may be generally located in the display area DA and the non-display area NDA. The via insulating layer VIA may partially expose the transistor substrate SUB in the non-display area NDA.

The transistor substrate SUB may be connected to the first light emitting element ED1. The first anode electrode ANO1 of the first light emitting element ED1 may be connected to the transistor substrate SUB through a contact hole penetrating the via insulating layer VIA. The first light emitting element ED1 may emit light from the first intermediate layer ML1 using a voltage applied to the first anode electrode ANO1, and using a voltage applied to the first cathode electrode CATH1.

A pixel defining layer PDL may be located on the via insulating layer VIA. The pixel defining layer PDL may serve to partition the pixels PX. The pixel defining layer PDL may partition the pixels PX by partitioning the light emitting elements. Also, the pixel defining layer PDL may serve as a dam together with the via insulating layer VIA in the non-display area NDA. The dam may reduce or prevent the organic material constituting the organic encapsulation layer OL spreading excessively in the process of forming the organic encapsulation layer OL.

The first inorganic encapsulation layer IL1 may be formed to cover the first light emitting device ED1, the pixel defining layer PDL, and the via insulating layer VIA. The organic encapsulation layer OL may be formed on the first inorganic encapsulation layer IL1, and may be relatively thickly formed to implement a flat top surface in the display area DA. The second inorganic encapsulation layer IL2 may be formed on the organic encapsulation layer OL. The second inorganic encapsulation layer IL2 may be located to cover the first inorganic encapsulation layer IL1 in the non-display area NDA.

The first color converting layer CVL1 may be located on the second inorganic encapsulation layer IL2 to overlap the first light emitting element ED1. The first color converting layer CVL1 may serve to convert a wavelength of light emitted from the first light emitting element ED1. To this end, the first color converting layer CVL1 may include one or more wavelength-converting materials and a resin.

The first bank layer BK1 may be located to have a flat top surface in the non-display area NDA. The first bank layer BK1 may be located in the non-display area NDA, and in this case, the first bank layer BK1 may be located to expose an outer area EXA located in the non-display area NDA, and which may be opposite to the display area DA.

The first inorganic insulating layer IIL1 may be located to cover the first color converting layer CVL1 and the first bank layer BK1. The first inorganic insulating layer IIL1 may be located to cover a top surface and side surfaces of the first bank layer BK1 and a top surface of the transistor substrate SUB. The first inorganic insulating layer IIL1 may include an inorganic insulating material.

The low refractive layer LR may be located on the first inorganic insulating layer IIL1. The low refractive layer LR may have a relatively lower refractive index than that of the first color converting layer CVL1. Accordingly, the low refractive layer LR may recycle at least a part of the light emitted from the first light emitting element ED1 to improve light utilization efficiency. As a result, the light efficiency of the display device DD may be improved.

The low refractive layer LR may be located in the display area DA and the non-display area NDA. The low refractive layer LR may be located on the first inorganic insulating layer IIL1 in the non-display area NDA, and may overlap the first bank layer BK1. In this case, the low refractive layer LR may be located not to overlap the outer area EXA. The second inorganic insulating layer IIL2 may be located to cover the low refractive layer LR. The second inorganic insulating layer IIL2 may include an inorganic insulating material.

The first color filter layer CF1 may be located on the non-display area NDA to cover the first inorganic insulating layer IIL1 and the second inorganic insulating layer IIL2. The first color filter layer CF1 may serve to seal the first bank layer BK1 together with the first inorganic insulating layer IIL1. The first color filter layer CF1 may be located on the outermost portion of the display device DD, and thus the first color filter layer CF1 may be exposed to the outside.

The second color filter layer CF2 may be located on the non-display area NDA to cover the first color filter layer CF1. The second color filter layer CF2 also may be located to overlap the first light emitting element ED1 in the display area DA.

The third color filter layer CF3 may be located on the second color filter layer CF2 in the non-display area NDA.

In some embodiments, the first to third color filter layers CF1, CF2, and CF3 may each correspond to color filter layers of various colors. For example, the first color filter layer CF1 may be a green color filter layer, the second color filter layer CF2 may be a red color filter layer, and the third color filter layer CF3 may be a blue color filter layer.

In an area where the first to third color filter layers CF1, CF2, and CF3 overlap, the first to third color filter layers CF1, CF2, and CF3 may instead serve as, or function as, a black matrix, which will be described later. Accordingly, a separate black matrix does not need to be located in the area where the first to third color filter layers CF1, CF2, and CF3 overlap.

The overcoat layer OC may be located throughout the display area DA and the non-display area NDA. The overcoat layer OC may be located on the color filter layer to have a flat top surface.

In embodiments, a protective film may be attached on the overcoat layer OC. In this case, for the protective film to be suitably attached, the overcoat layer OC must be formed to have a flat top surface. In the display device DD according to some embodiments, as the first bank layer BK1 is located to have a flat top surface on the non-display area NDA, the overcoat layer OC may be located to have a flat top surface.

In addition, in the display device DD according to some embodiments, the first to third color filter layers CF1, CF2, and CF3 are located to overlap the non-display area NDA, so that the first to third color filter layers CF1, CF2, and CF3 may serve as a light blocking member.

Also, in the display device DD according to some embodiments, as the first color filter layer CF1 is located while sealing the first bank layer BK1 in the outer area EXA of the display device DD, it is possible to block external moisture or heat penetrating into the outer area EXA of display device DD.

Conventionally, the low refractive layer LR is located up to the outer area EXA, and the low refractive layer LR is located while sealing the first bank layer BK1 in the outer area EXA of the display device DD. Accordingly, in this case, defects such as cracks may have occurred in the outer area EXA of the display device DD due to the characteristics of the low refractive layer LR, which generally may be weak to external impact. However, in the display device DD according to some embodiments, as the first color filter layer CF1 is located while sealing the first bank layer BK1 in the outer area EXA of the display device DD, the display device DD may have a characteristic of resistance or durability against external impact.

FIG. 2B may be substantially the same as FIG. 2A, except that the bank pattern DM is additionally formed. Accordingly, a description of the overlapping configuration will be omitted.

Figure 6:
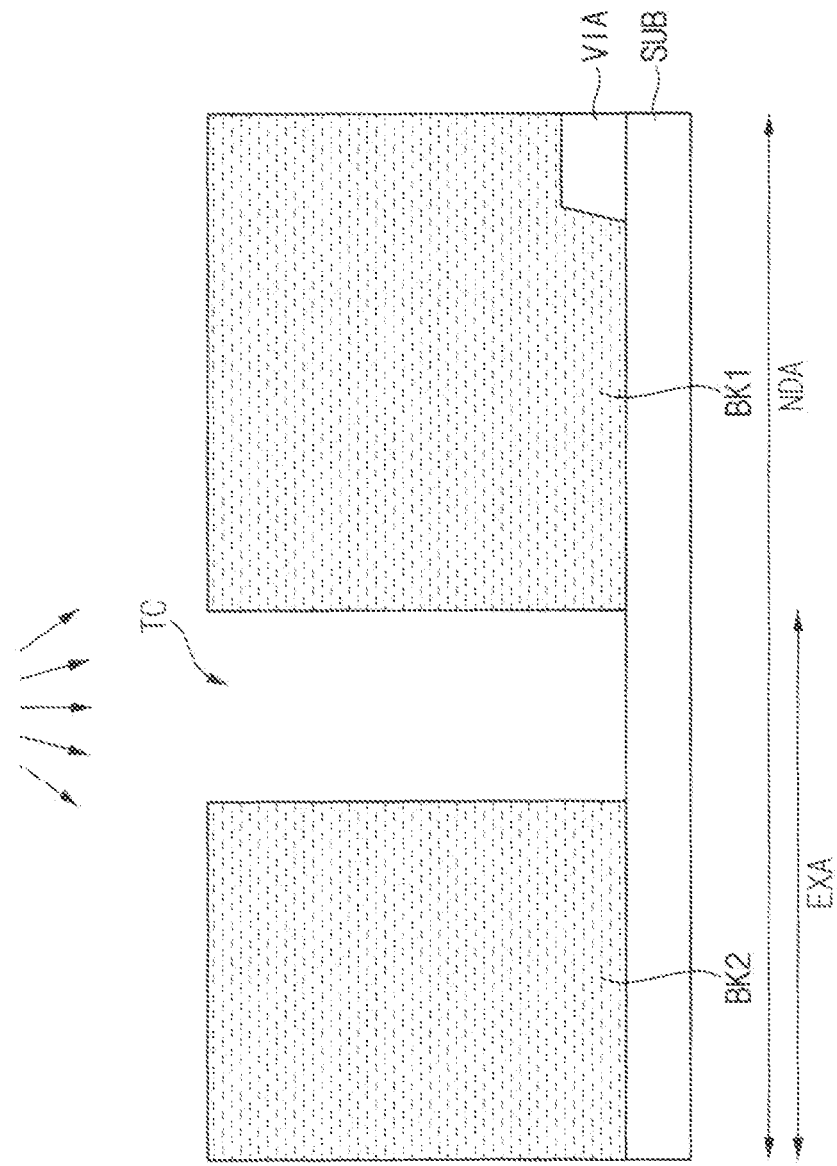

Referring to FIG. 2B, a bank pattern DM may be formed on or at the first bank layer BK1. The bank pattern DM may be formed by the same process as that of forming a trench TC when the trench TC illustrated in FIG. 6 is formed, which will be described later. The bank pattern DM may be defined as a space for accommodating ink that is mis-deposited or misplaced while the first color converting layer CVL1 is formed. Accordingly, it is possible to reduce or prevent the likelihood of cracks, gap defects, etc. occurring in the first inorganic insulating layer IIL1 formed on the first bank layer BK1 due to the erroneous or mis-deposited ink.

Figure 3:
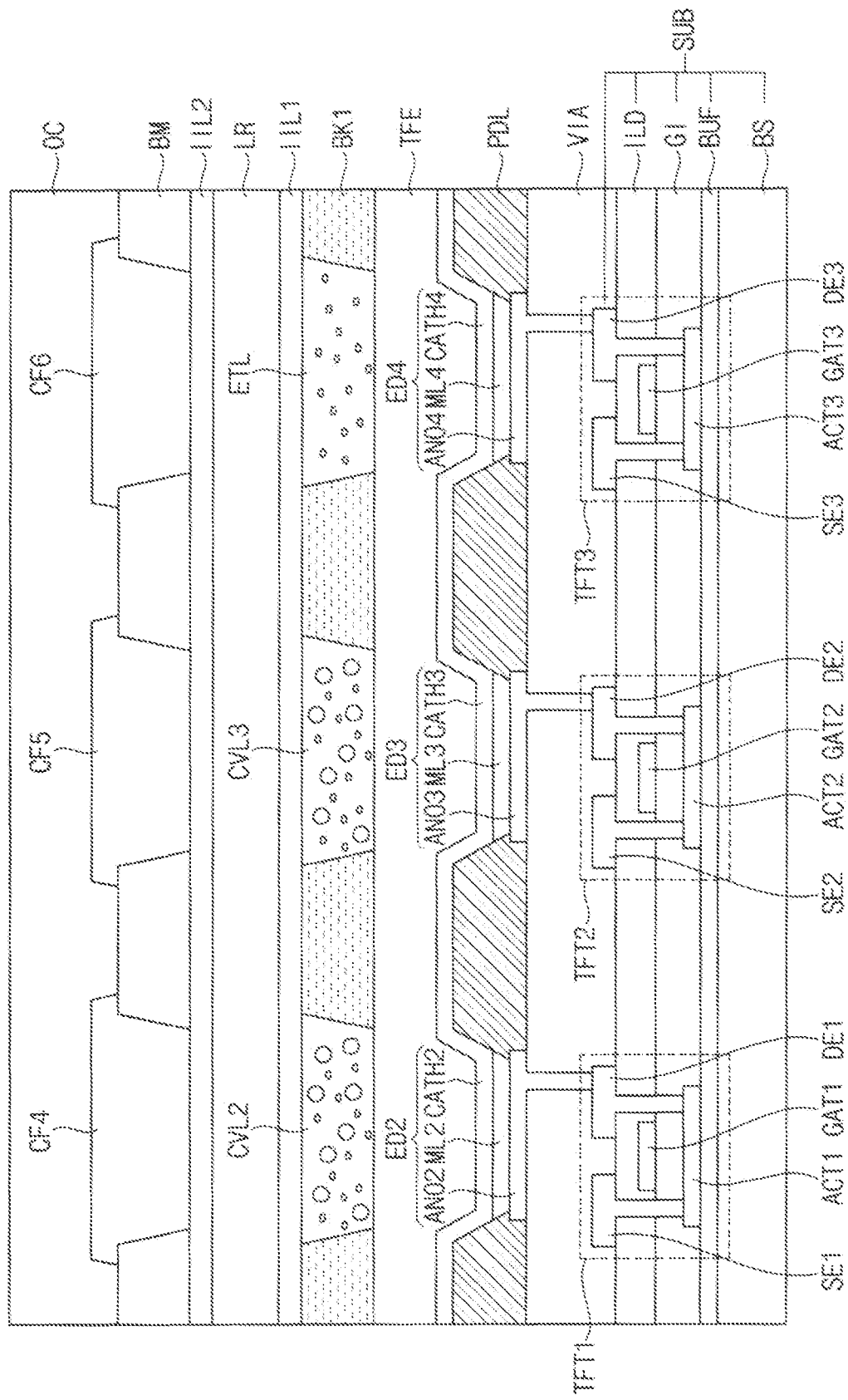
FIG. 3 is a cross-sectional view illustrating some embodiments in which a pixel included in the display device of FIG. 1 is cut along the line II-II'.

FIG. 3 is a cross-sectional view illustrating some embodiments in which a pixel included in the display device of FIG. 1 is cut along the line II-II'.

Referring to FIGS. 1 and 3, the display device DD may include a base substrate BS, a buffer layer BUF, first to third transistors TFT1, TFT2, TFT3, a gate insulating layer GI, an interlayer insulating layer ILD, a via insulating layer VIA, a pixel defining layer PDL, second to fourth light emitting elements ED2, ED3, ED4, a thin film encapsulation layer TFE, a first bank layer BK1, second and third color converting layers CVL2, CVL3, a light transmitting layer ETL, a first inorganic insulating layer IIL1, a low refractive index layer LR, a second inorganic insulating layer IIL2, a black matrix BM, fourth to sixth color filter layers CF4, CF5, and CF6, and an overcoat layer OC.

The first transistor TFT1 may include a first active layer ACT1, a first gate electrode GAT1, a first source electrode SE1, and a first drain electrode DE1. The second transistor TFT2 may include a second active layer ACT2, a second gate electrode GAT2, a second source electrode SE2, and a second drain electrode DE2. The third transistor TFT3 may include a third active layer ACT3, a third gate electrode GAT3, a third source electrode SE3, and a third drain electrode DE3.

The second light emitting element ED2 may include a second anode electrode ANO2, a second intermediate layer ML2, and a second cathode electrode CATH2. The third light emitting element ED3 may include a third anode electrode ANO3, a third intermediate layer ML3, and a third cathode electrode CATH3. The fourth light emitting element ED4 may include a fourth anode electrode ANO4, a fourth intermediate layer ML4, and a fourth cathode electrode CATH4.

The base substrate BS may include a flexible material or a rigid material. For example, the base substrate BS may have flexible properties by including a polymer material such as polyimide. Alternatively, for example, the base substrate BS may have a rigid characteristic by including a material such as glass.

The buffer layer BUF may be located on the base substrate BS. The buffer layer BUF may include an inorganic insulating material. Examples of the material that can be used as the buffer layer BUF may include silicon oxide ("SiOx"), silicon nitride ("SiNx"), silicon oxynitride ("SiON"), and the like. These may be used alone or in combination with each other. The buffer layer BUF may reduce or prevent metal atoms or impurities diffusing into the active layers ACT1, ACT2, ACT3. In addition, the buffer layer BUF may control the rate of heat provided to the first to third active layers ACT1, ACT2, ACT3 during the crystallization process for forming the first to third active layers ACT1, ACT2, ACT3.

The first to third active layers ACT1, ACT2, ACT3 may be located on the buffer layer BUF. In some embodiments, the first to third active layers ACT1, ACT2, ACT3 may include a silicon semiconductor. For example, the first to third active layers ACT1, ACT2, ACT3 may include amorphous silicon, polycrystalline silicon, or the like. Alternatively, in some embodiments, the first to third active layers ACT1, ACT2, ACT3 may include an oxide semiconductor. For example, the first to third active layers ACT1, ACT2, ACT3 may include indium-gallium-zinc oxide (IGZO), indium-gallium oxide (IGO), indium-zinc oxide (IZO), or the like.

The gate insulating layer GI may be located on the buffer layer BUF. The gate insulating layer GI may be located to cover the first to third active layers ACT1, ACT2, ACT3. The gate insulating layer GI may include an insulating material. Examples of the material that may be used as the gate insulating layer GI may include silicon oxide ("SiOx"), silicon nitride ("SiNx"), silicon oxynitride ("SiON"), and the like. These may be used alone or in combination with each other.

The first to third gate electrodes GAT1, GAT2, GAT3 may be located on the gate insulating layer GI. The first to third gate electrodes GAT1, GAT2, GAT3 may respectively overlap the first to third active layers ACT1, ACT2, ACT3. In response to a gate signal provided to the first to third gate electrodes GAT1, GAT2, GAT3, a signal and/or a voltage may flow through the first to third active layers ACT1, ACT2, ACT3. In some embodiments, the first to third gate electrodes GAT1, GAT2, GAT3 may include a metal, an alloy, a metal oxide, a transparent conductive material, or the like. For example, the first to third gate electrodes GAT1, GAT2, GAT3 may include silver ("Ag"), an alloy containing silver, molybdenum ("Mo"), an alloy containing molybdenum, aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide (ITO), indium zinc oxide (IZO), or the like.

The interlayer insulating layer ILD may be located on the gate insulating layer GI. The interlayer insulating layer ILD may be located to cover the first to third gate electrodes GAT1, GAT2, GAT3. In some embodiments, the interlayer insulating layer ILD may include an insulating material. Examples of the material that can be used as the interlayer insulating layer ILD may include silicon oxide ("SiOx"), silicon nitride ("SiNx"), silicon oxynitride ("SiON"), and the like. These may be used alone or in combination with each other.

The first to third source electrodes SE1, SE2, SE3 and the first to third drain electrodes DE1, DE2, DE3 may be located on the interlayer insulating layer ILD. The first source electrode SE1 and the first drain electrode DE1 may contact the first active layer ACT1. The second source electrode SE2 and the second drain electrode DE2 may contact the second active layer ACT2. The third source electrode SE3 and the third drain electrode DE3 may contact the third active layer ACT3. In some embodiments, the first to third source electrodes SE1, SE2, SE3 and the first to third drain electrodes DE1, DE2, DE3 may include a metal, an alloy, a metal oxide, a transparent conductive material, or the like. For example, each of the first to third source electrodes SE1, SE2, SE3 and the first to third drain electrodes DE1, DE2, DE3 may include silver ("Ag"), an alloy containing silver, molybdenum ("Mo"), an alloy containing molybdenum, aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide (ITO), indium zinc oxide (IZO), or the like.

The via insulating layer VIA may be located on the interlayer insulating layer ILD. The via insulating layer VIA may be located to cover the first to third source electrodes SE1, SE2, SE3 and the first to third drain electrodes DE1, DE2, DE3. In some embodiments, the via insulating layer VIA may include an organic insulating material. For example, the via insulating layer VIA may include a photoresist, a polyacrylic resin, a polyimide resin, an acrylic resin, or the like. The via insulating layer VIA may have a substantially flat top surface.

The second to fourth anode electrodes ANO2, ANO3, ANO4 may be located on the via insulating layer VIA. The second to fourth anode electrodes ANO2, ANO3, ANO4 may contact the first to third drain electrodes DE1, DE2, DE3, respectively. In some embodiments, each of the second to fourth anode electrodes ANO2, ANO3, ANO4 may include a metal, an alloy, a metal oxide, a transparent conductive material, or the like. For example, each of the second to fourth anode electrodes ANO2, ANO3, ANO4 may include silver ("Ag"), an alloy containing silver, molybdenum ("Mo"), an alloy containing molybdenum, aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide (ITO), indium zinc oxide (IZO), or the like.

The pixel defining layer PDL may be located on the via insulating layer VIA. Openings exposing the second to fourth anode electrodes ANO2, ANO3, ANO4 may be formed in the pixel defining layer PDL. In some embodiments, the pixel defining layer PDL may include an organic material. For example, the pixel defining layer PDL may include a photoresist, a polyacrylic resin, a polyimide resin, an acrylic resin, or the like.

The second to fourth intermediate layers ML2, ML3, ML4 may be respectively located on the second to fourth anode electrodes ANO2, ANO3, ANO4. The second to fourth intermediate layers ML2, ML3, ML4 may include an organic material emitting light of a corresponding color (e.g., a predetermined color). The second to fourth intermediate layers ML2, ML3, ML4 may emit light based on the potential difference between the second to fourth anode electrodes ANO2, ANO3, ANO4 and the second to fourth cathode electrodes CATH2, CATH3, CATH4, respectively.

The second to fourth light emitting elements ED2, ED3, ED4 may emit light having the same color as each other. For example, all of the second to fourth light emitting elements ED2, ED3, ED4 may emit blue light. Alternatively, the second to fourth light emitting elements ED2, ED3, ED4 may emit light of different respective colors. For example, the second to fourth light emitting elements ED2, ED3, ED4 may respectively emit red light, green light, and blue light.

The second to fourth cathode electrodes CATH2, CATH3, CATH4 may be located on the second to fourth light emitting elements ED2, ED3, ED4. The second to fourth cathode electrodes CATH2, CATH3, CATH4 may include silver metal, an alloy, a metal oxide, a transparent conductive material, or the like. For example, the second to fourth cathode electrodes CATH2, CATH3, CATH4 may include silver ("Ag"), an alloy containing silver, molybdenum ("Mo"), an alloy containing molybdenum, aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide (ITO), indium zinc oxide (IZO), or the like. For convenience of description, the cathode electrode has been described as being divided into, or identified as, the second to fourth cathode electrodes CATH2, CATH3, CATH4, but the second to fourth cathode electrodes CATH2, CATH3, CATH4 may be integrally formed.

The encapsulation layer TFE may be located on the second to fourth cathode electrodes CATH2, CATH3, CATH4. The encapsulation layer TFE may have a structure in which an inorganic encapsulation layer and an organic encapsulation layer are stacked.

The first bank layer BK1, the second and third color converting layers CVL2, CVL3, and a light transmitting layer ETL may be located on the encapsulation layer TFE. The first bank layer BK1 may include an organic material. The first bank layer BK1 may block light emitted from below. The first bank layer BK1 may include an opening through which the encapsulation layer TFE is exposed. The second and third color converting layers CVL2, CVL3 and the light transmitting layer ETL may be located in the opening. In some embodiments, the bank pattern DM shown in FIG. 2B may be formed on the first bank layer BK1. Accordingly, when the second and third color converting layers CVL2, CVL3 and the light transmitting layer ETL are formed, the bank pattern DM may accommodate inks that are erroneously deposited.

The second color converting layer CVL2 may be located to overlap the second light emitting element ED2. The second color converting layer CVL2 may convert a wavelength of light emitted from the second light emitting element ED2. To this end, the second color converting layer CVL2 may include a phosphor, a scatterer, and a quantum dot. For example, blue light emitted from the second light emitting element ED2 may be converted into red light by passing through the second color converting layer CVL2.

The third color converting layer CVL3 may be located to overlap the third light emitting element ED3. The third color converting layer CVL3 may convert a wavelength of light emitted from the third light emitting element ED3. To this end, the third color converting layer CVL3 may include a phosphor, a scatterer, and a quantum dot. For example, blue light emitted from the third light emitting element ED3 may be converted into green light by passing through third color converting layer CVL3.

The light transmitting layer ETL may be located to overlap the fourth light emitting element ED4. The light transmitting layer ETL may transmit light emitted from the fourth light emitting element ED4. To this end, the light transmitting layer ETL may include a transparent polymer material and a scatterer. For example, blue light emitted from the fourth light emitting element ED4 may pass through the light transmitting layer ETL as it is.

A first inorganic insulating layer IIL1 may be located on the first bank layer BK1, the second and third color conversion layers CVL2, CVL3, and the light transmitting layer ETL. The first inorganic insulating layer IIL1 may reduce or prevent impurities, such as moisture and air, from penetrating from the outside. Examples of the material that may be used as the first inorganic insulating layer IIL1 may include silicon oxide ("SiOx"), silicon nitride ("SiNx"), silicon oxynitride ("SiON"), and the like. These may be used alone or in combination with each other.

The low refractive layer LR may be located on the first inorganic insulating layer IIL1. The low refractive layer LR may have a relatively lower refractive index than that of the second color converting layer CVL2, the third color converting layer CVL3, and the light transmitting layer ETL. Accordingly, the low refractive layer LR may recycle at least a part of the light emitted from the second to fourth light emitting elements ED2, ED3, ED4, thereby improving light use efficiency. As a result, the light efficiency of the display device DD may be improved.

The second inorganic insulating layer IIL2 may be located on the low refractive layer LR. The second inorganic insulating layer IIL2 may reduce or prevent impurities, such as moisture and air, from penetrating from the outside. Examples of the material that may be used as the second inorganic insulating layer IIL2 may include silicon oxide ("SiOx"), silicon nitride ("SiNx"), silicon oxynitride ("SiON"), and the like. These may be used alone or in combination with each other.

The black matrix BM and fourth to sixth color filter layers CF4, CF5, CF6 may be located on the second inorganic insulating layer IIL2. The black matrix BM may include a material capable of blocking light. For example, the black matrix BM may be formed of a material including an organic pigment of a suitable color (e.g., black). Accordingly, the black matrix BM may block some of the light emitted from therebelow.

The fourth color filter layer CF4 may be located to overlap the second color converting layer CVL2. The fourth color filter layer CF4 may transmit only light of a partial wavelength among the light transmitted from the second color converting layer CVL2. For example, the fourth color filter layer CF4 may transmit only light having a wavelength corresponding to red light.

The fifth color filter layer CF5 may be located to overlap the third color converting layer CVL3. The fifth color filter layer CF5 may transmit only light of a partial wavelength among the light transmitted from the third color converting layer CVL3. For example, the fifth color filter layer CF5 may transmit only light having a wavelength corresponding to green light.

The sixth color filter layer CF6 may be located to overlap the light transmitting layer ETL. The sixth color filter layer CF6 may transmit only light having a partial wavelength among the light transmitted from the light transmitting layer ETL. For example, the sixth color filter layer CF6 may transmit only light having a wavelength corresponding to blue light.

In embodiments, the fourth to sixth color filter layers CF4, CF5, CF6 may respectively correspond to the first to third color filter layers CF1, CF2, CF3 of FIG. 2A. For example, the fifth color filter layer CF5 may correspond to the first color filter layer CF1 of FIG. 2A, and the fourth color filter layer CF4 may correspond to the second color filter layer CF2 of FIG. 2A, The sixth color filter layer CF6 may correspond to the third color filter layer CF3 of FIG. 2A.

An overcoat layer OC may be located on the black matrix BM and the fourth to sixth color filter layers CF4, CF5, CF6. The overcoat layer OC may be located on the black matrix BM and the fourth to sixth color filter layers CF4, CF5, CF6 to have a substantially flat top surface. The overcoat layer OC may include an insulating material, and may be formed by an inkjet printing method.

FIGS. 4 to 13 are views illustrating a method of manufacturing the display device of FIG. 1. FIGS. 4 to 13 may correspond to views illustrating some embodiments of manufacturing area A in the cross-sectional view of FIG. 2A.

Figure 4:
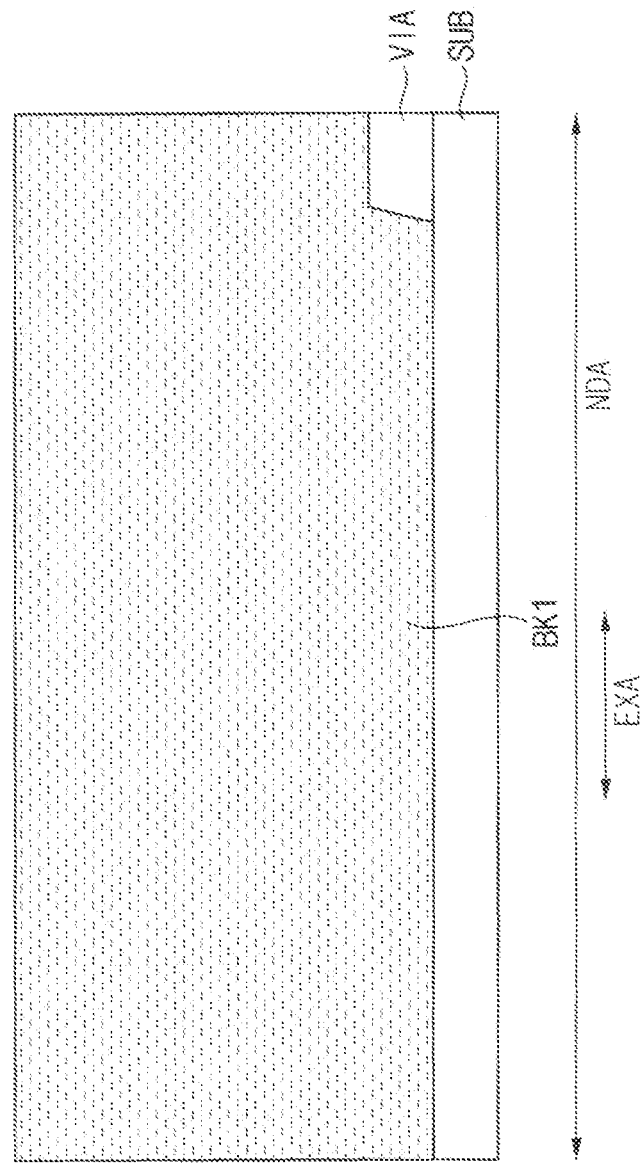
Figure 5:
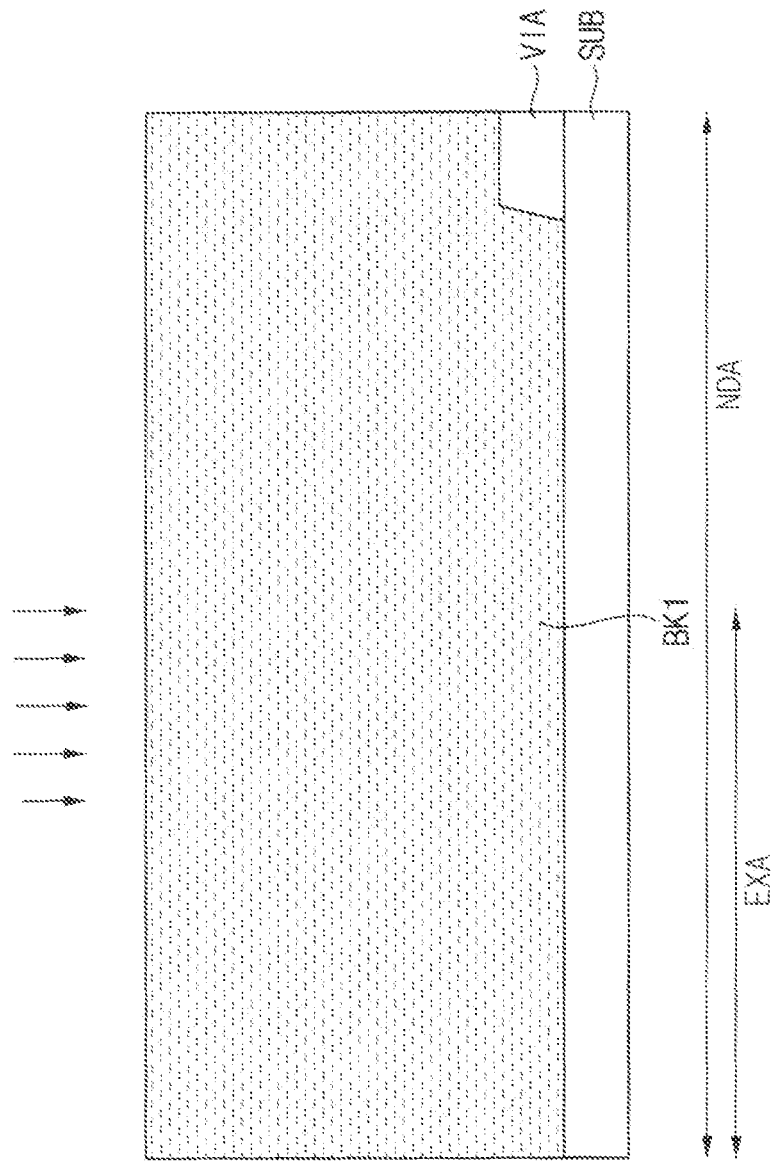

Referring to FIGS. 4, 5, and 6, a trench TC may be formed in the first bank layer BK1 located on the transistor substrate SUB and having a flat top surface. Through this, the first bank layer BK1 and the second bank layer BK2 may be formed. The trench TC may be formed in a portion of the non-display area NDA.

Figure 7:
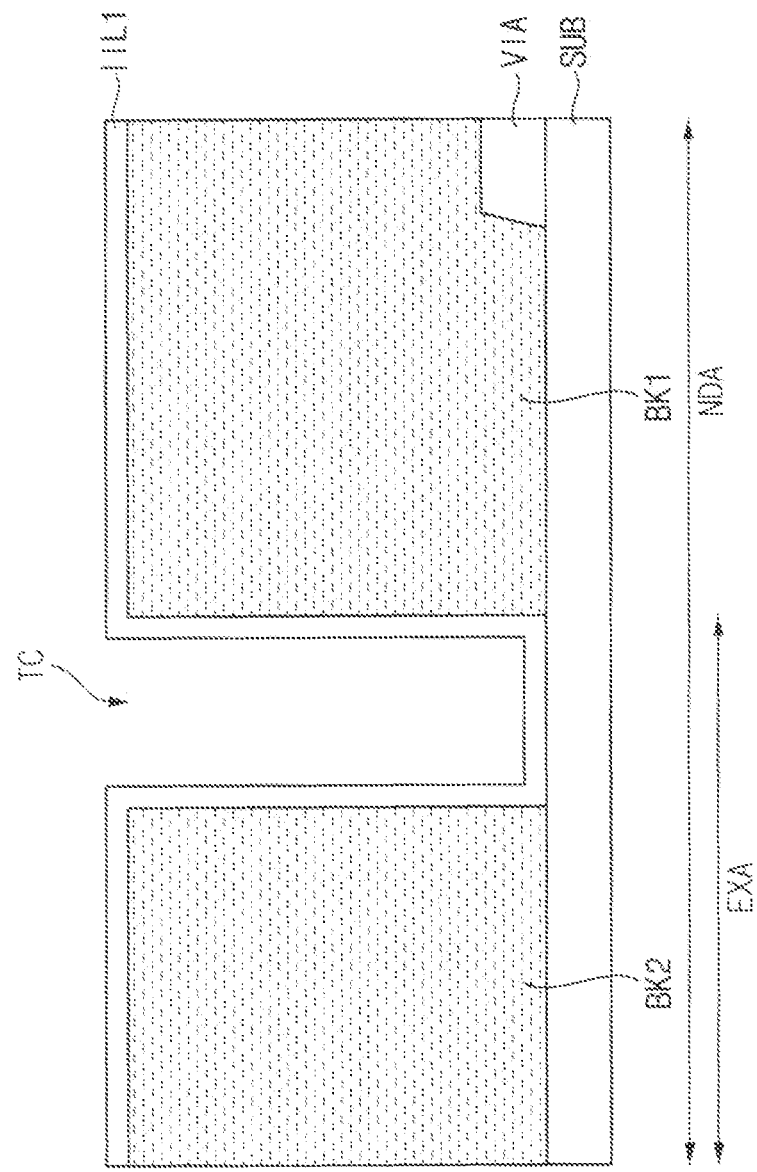

Referring to FIG. 7, a first inorganic insulating layer IIL1 may be formed to cover the first bank layer BK1, the second bank layer BK2, and the trench TC (e.g., sides of the trench TC, or on sides of the first and second bank layer BK1, BK2 that define the trench TC). The first inorganic insulating layer IIL1 may be formed by chemical vapor deposition.

Figure 8:
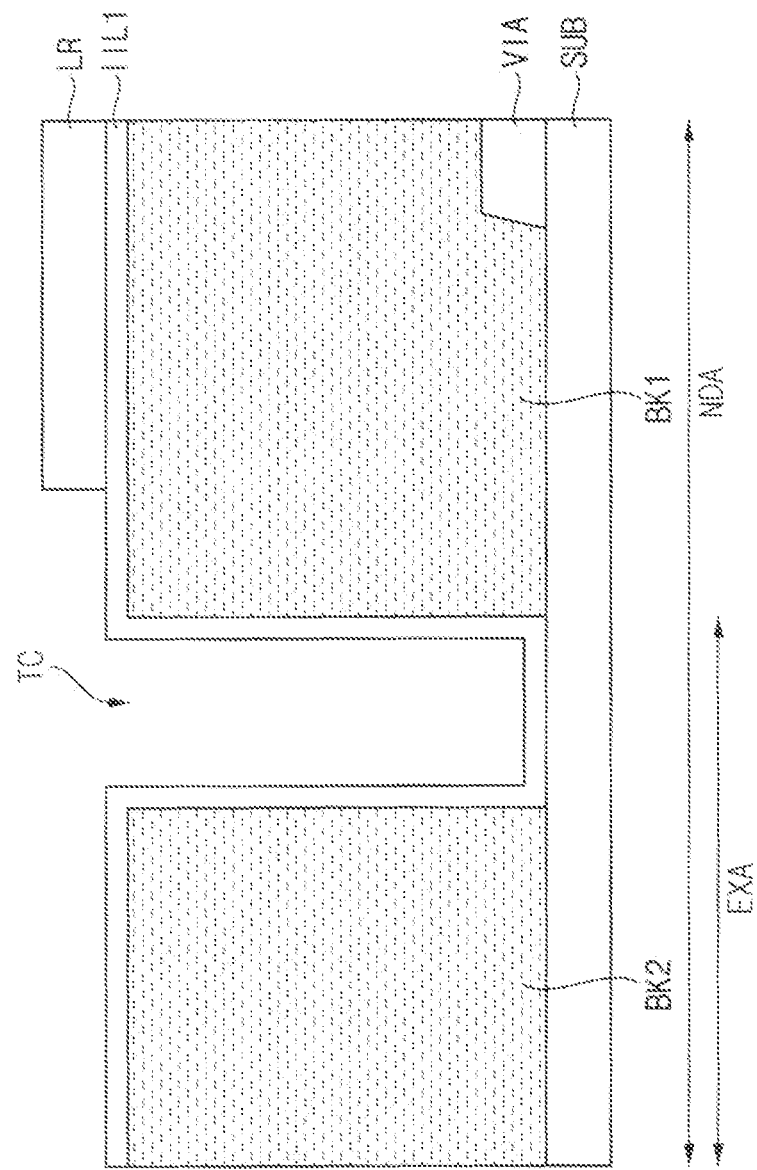

Referring to FIG. 8, the low refractive layer LR may be formed on the first inorganic insulating layer IIL1. The low refractive layer LR may be formed by inkjet printing, and may be formed only on the upper portion of the first bank layer BK1 so as not to fill the trench TC.

Figure 9:
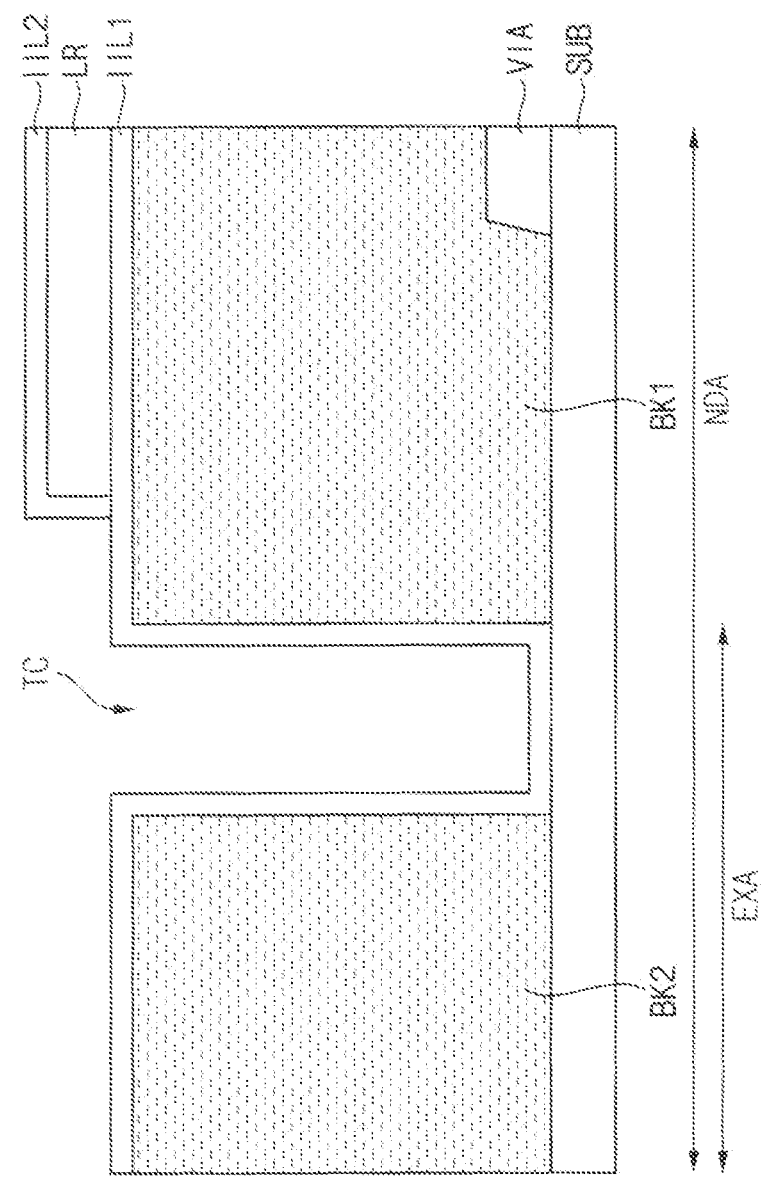

Referring to FIG. 9, the second inorganic insulating layer IIL2 may be formed to cover the low refractive layer LR. The second inorganic insulating layer IIL2 may be formed by chemical vapor deposition.

Figure 10:
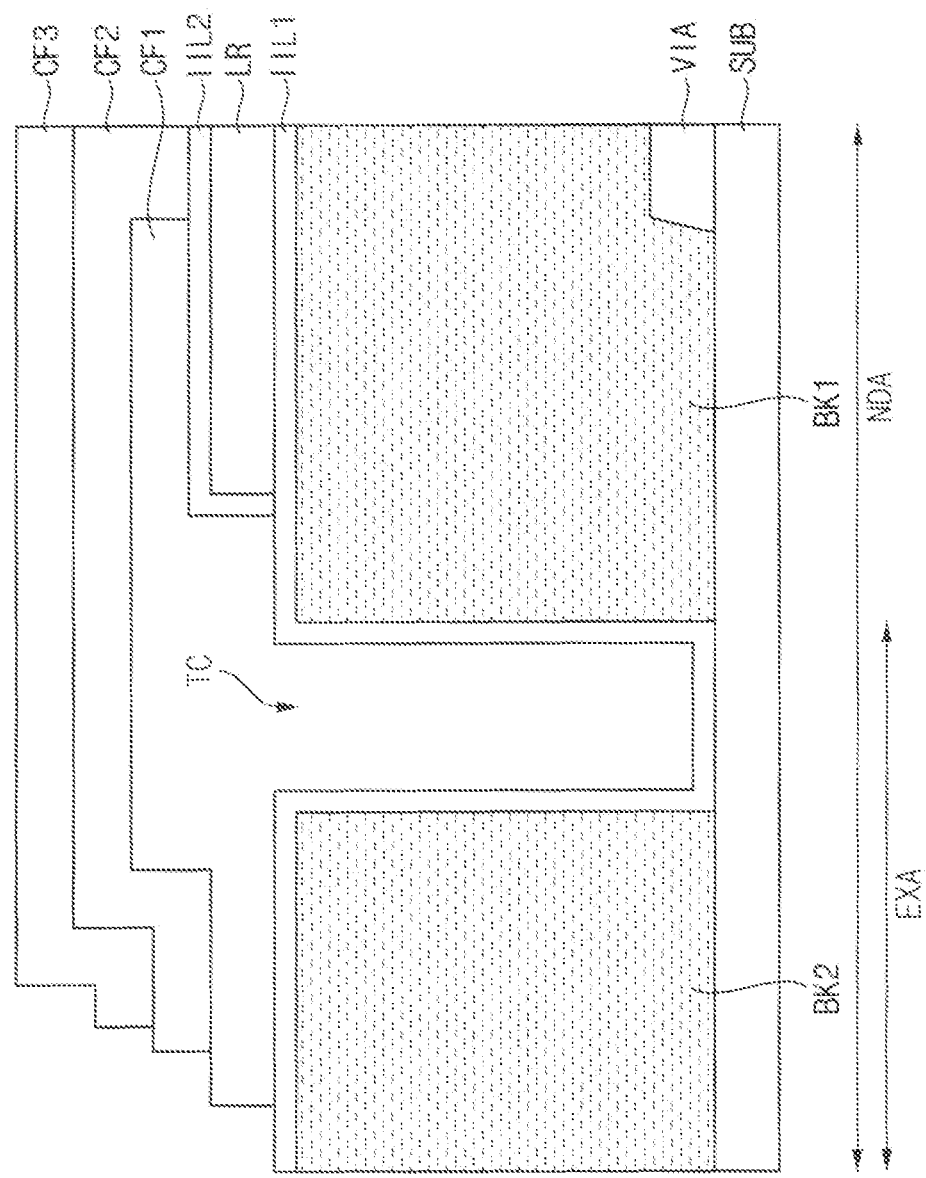

Referring to FIG. 10, the first color filter layer CF1 may be located to fill the trench TC, and the second color filter layer CF2 and the third color filter layer CF3 may be formed on the first color filter layer CF1. They may be formed sequentially. An area where the first to third color filter layers CF1, CF2, CF3 overlap may perform the same role as the aforementioned black matrix BM.

Figure 11:
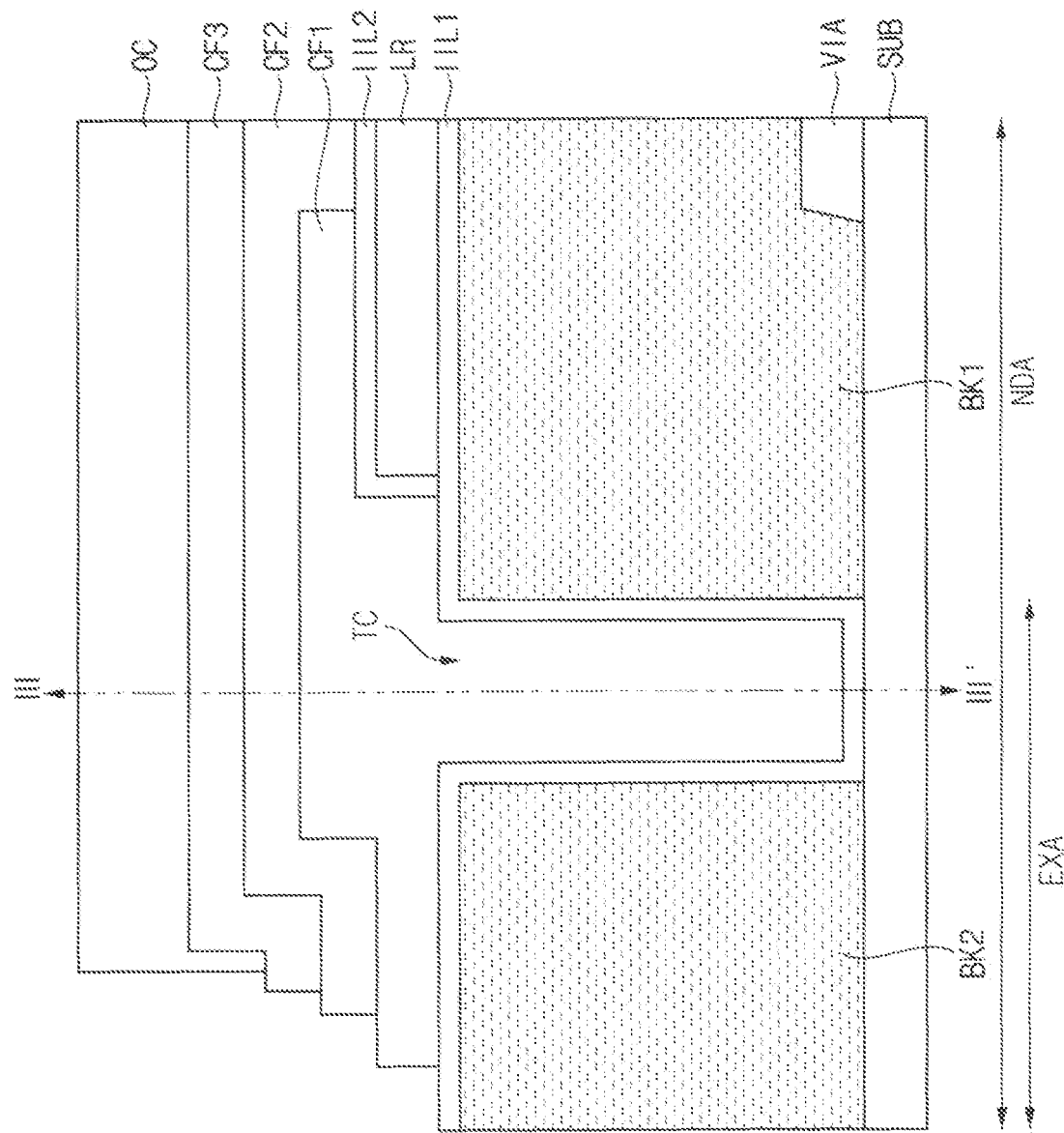
Figure 13:
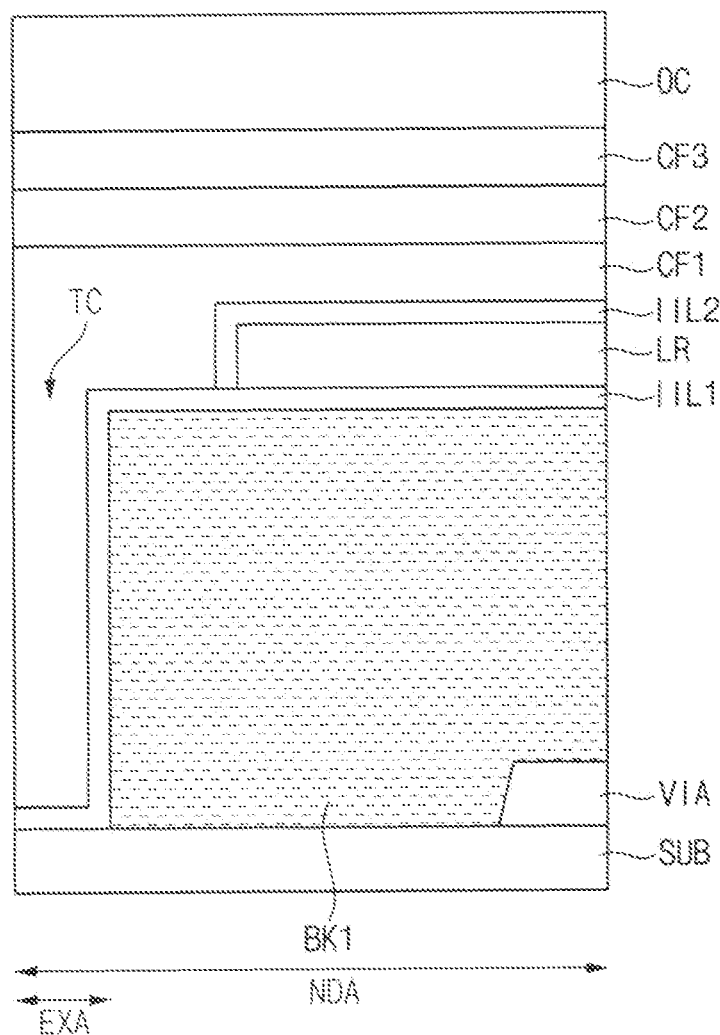

Referring to FIGS. 11 to 13, in the method of manufacturing the display device, after the overcoat layer OC is formed on a ledger cell, the ledger cell may be separated by a scribing process. Through this, the second bank layer BK2 of the outer area EXA may be exposed to the outside. That is, the scribing process may scribe the ledger cell to expose the second bank layer BK2. After that, grinding may be performed up to the III-III' line. By grinding, the part to the left of the III-III' line can be removed. Through this, the first color filter layer CF1 may be exposed to the outside of the display device DD. As the first color filter layer CF1 seals the first bank layer BK1, the first color filter layer CF1 may block external moisture or heat from penetrating into the inside of the display device DD. The second color filter layer CF2 and the third color filter layer CF3 may also be exposed to the outside of the display device DD, and may block external moisture or heat from penetrating into the inside of the display device DD.

Figure 14:
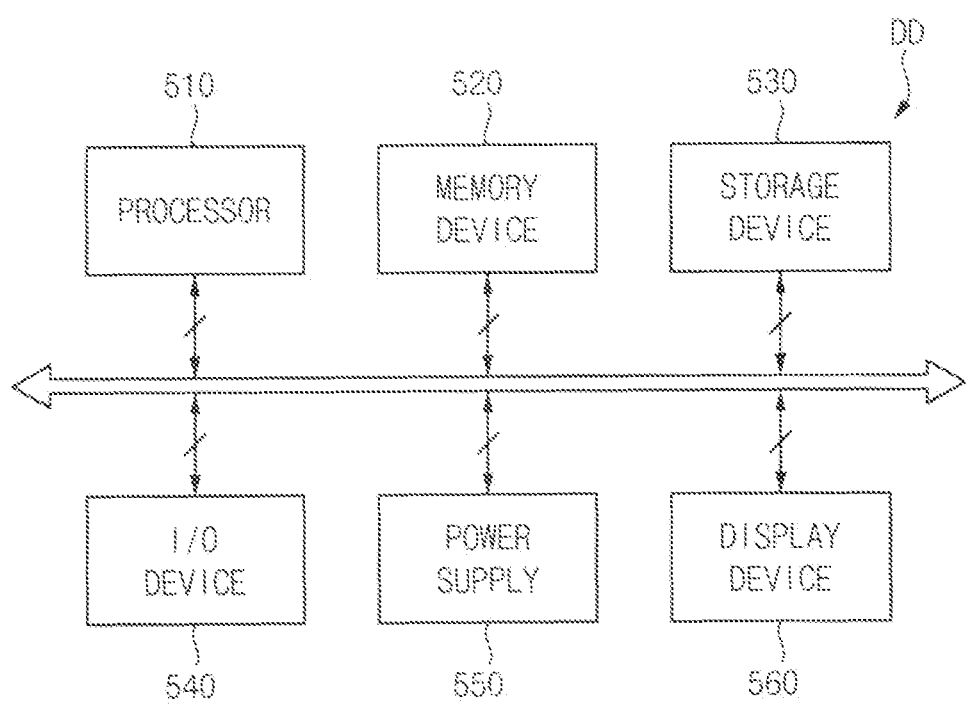
FIG. 14 is a block view illustrating an electronic device according to some embodiments.
Figure 15:
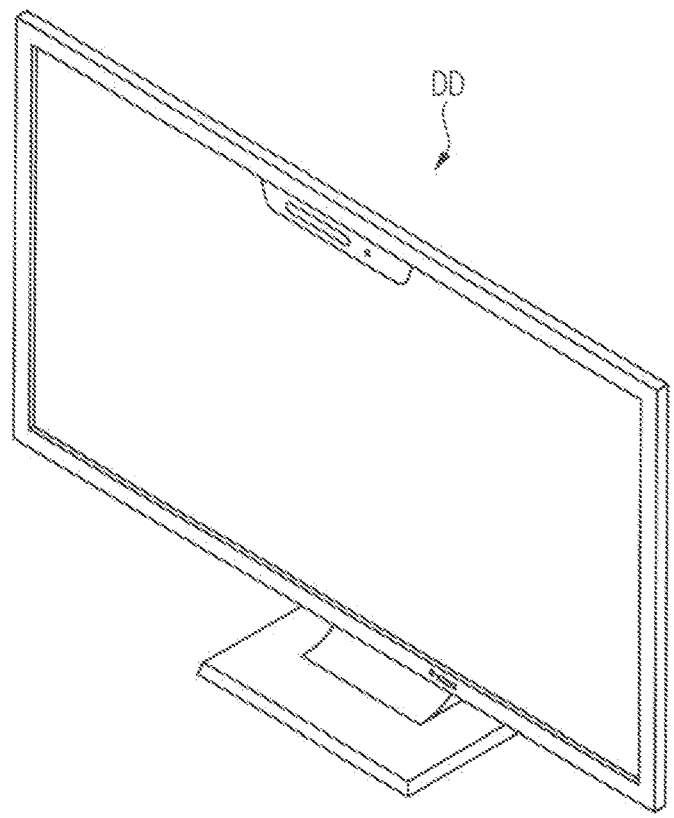
FIG. 15 is a view illustrating some embodiments in which the electronic device of FIG. 14 is implemented as a computer monitor.
Figure 16:
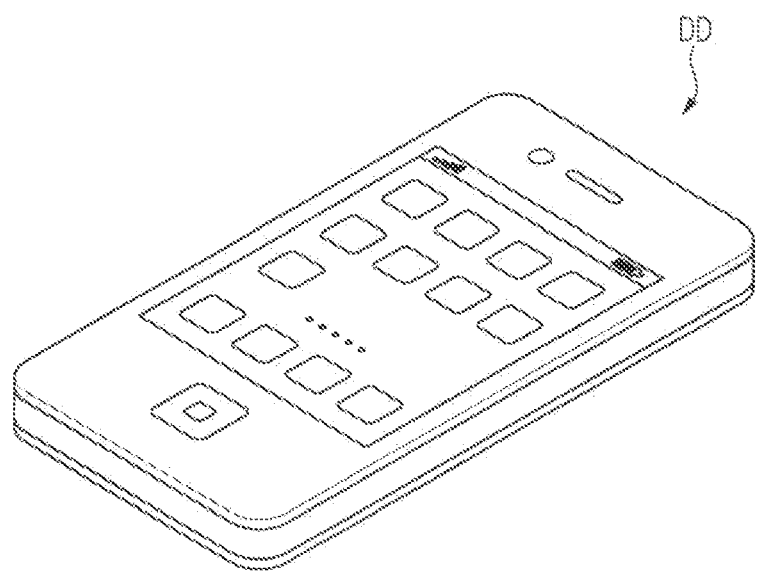
FIG. 16 is a view illustrating some embodiments in which the electronic device of FIG. 14 is implemented as a smartphone.

FIG. 14 is a block view illustrating an electronic device according to some embodiments, FIG. 15 is a view illustrating some embodiments in which the electronic device of FIG. 14 is implemented as a computer monitor, and FIG. 16 is a view illustrating some embodiments in which the electronic device of FIG. 14 is implemented as a smartphone.

Referring to FIGS. 14, 15 and 16, some embodiments of an electronic device DD may include a processor 510, a memory device 520, a storage device 530, an input/output device 540, a power supply 550, and a display device 560. In such some embodiments, the display device 560 may correspond to the display device described above with reference to the above drawings. The electronic device DD may further include several ports capable of communicating with a video card, a sound card, a memory card, a USB device, and the like. In some embodiments, as illustrated in FIG. 15, the electronic device DD may be implemented as a television. In other embodiments, as illustrated in FIG. 16, the electronic device DD may be implemented as a smartphone. However, the electronic device DD is not limited thereto, and for example, the electronic device DD includes a mobile phone, a video phone, a smart pad, a smart watch, a tablet PC, a vehicle navigation system, it may be implemented as a computer monitor, notebook computer, head mounted display ("HMD"), or the like.

The processor 510 may perform specific calculations or tasks. In some embodiments, the processor 510 may be a microprocessor, a central processing unit ("CPU"), an application processor ("AP"), or the like. The processor 510 may be connected to other components through an address bus, a control bus, a data bus, or the like. In some embodiments, the processor 510 may also be connected to an expansion bus such as a peripheral component interconnect ("PCI") bus.

The memory device 520 may store data used for the operation of the electronic device DD. In some embodiments, for example, the memory device 520 may include nonvolatile memory device such as an erasable programmable read-only memory ("EPROM") device, an electrically erasable programmable read-only memory ("EEPROM") device, a flash memory device, and a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, and/or volatile memory device such as a dynamic random access memory ("DRAM") device, a static random access memory ("SRAM") device, a mobile DRAM device.

The storage device 530 may include a solid state drive ("SSD"), a hard disk drive ("HDD"), a CD-ROM, or the like. The input/output device 540 may include an input means such as a keyboard, a keypad, a touch pad, a touch screen, and a mouse, and an output means such as a speaker and a printer.

The power supply 550 may supply power required for the operation of the electronic device DD. The display device 560 may be coupled to other components via buses or other communication links. According to some embodiments, the display device 560 may be included in the input/output device 540.

Embodiments of the display device may be applied to a display device included in a computer, a notebook, a mobile phone, a smartphone, a smart pad, a personal media player ("PMP"), a personal digital assistant ("PDA"), an MP3 player, or the like.

The present disclosure should not be construed as being limited to the embodiments set forth herein. Rather, these embodiments are provided so that this disclosure will be thorough and complete and will fully convey the concept of the present disclosure to those skilled in the art.

While embodiments of the present disclosure have been particularly shown and described with reference to embodiments thereof, it will be understood by those of ordinary skill in the art that various changes in form and details may be made therein without departing from the spirit or scope of the present disclosure as defined by the following claims, with functional equivalents thereof to be included therein.

What is claimed is:

1. A display device, comprising:
    a transistor substrate comprising a driving element, and having a display area, and a non-display area surrounding the display area;
    a bank layer on the non-display area of the transistor substrate, and exposing an outer area of the non-display area of the transistor substrate that is opposite to the display area;
    an inorganic insulating layer covering an upper surface of the bank layer, a side surface of the bank layer, and the outer area of the transistor substrate;
    a low refractive layer on the inorganic insulating layer; and
    a first color filter layer on the non-display area to cover a portion of an upper surface of the inorganic insulating layer, and a side surface of the inorganic insulating layer.

2. The display device of claim 1, wherein the first color filter layer seals the bank layer, and
    wherein a side surface of the first color filter layer is exposed to an outside.

3. The display device of claim 1, further comprising a second color filter layer on the first color filter layer on the non-display area.

4. The display device of claim 3, further comprising a third color filter layer on the second color filter layer on the non-display area.

5. The display device of claim 4, wherein the first color filter layer seals the bank layer, and side surfaces of the first to third color filter layers are exposed to an outside.

6. The display device of claim 1, wherein the inorganic insulating layer covers the outer area of the transistor substrate.

7. The display device of claim 1, wherein the low refractive layer overlaps the bank layer on the upper surface of the inorganic insulating layer.

8. The display device of claim 1, further comprising a light emitting element on and connected to the driving element.

9. The display device of claim 8, further comprising:
    a color converting layer on the light emitting element to overlap the light emitting element;
    a second color filter layer on the color converting layer; and
    a third color filter layer on the first color filter layer,
    wherein the second color filter layer is a same as one of the first or third color filter layers.

10. A display device, comprising:
    a transistor substrate comprising a driving element, and having a display area, and a non-display area surrounding the display area;
    a bank layer on the non-display area of the transistor substrate, and exposing an outer area of the non-display area of the transistor substrate that is opposite to the display area; and
    a first color filter layer on the outer area of the transistor substrate, sealing the bank layer, and having a side surface exposed to an outside.

11. The display device of claim 10, further comprising:
    a second color filter layer on the first color filter layer; and
    a third color filter layer on the second color filter layer.

12. The display device of claim 11, further comprising a light emitting element on and connected to the driving element.

13. The display device of claim 12, further comprising:
    a color converting layer overlapping the light emitting element; and
    a fourth color filter layer on the color converting layer, wherein the fourth color filter layer is a same as one of the first, second, or third color filter layers.

14. The display device of claim 10, wherein the first color filter layer is located on an upper surface of the bank layer.

15. The display device of claim 14, wherein the first color filter layer overlaps the upper surface of the bank layer.

16. The display device of claim 10, further comprising an inorganic insulating layer between the first color filter layer and the bank layer.

17. A method of manufacturing a display device, the method comprising:
- forming a first bank layer on a non-display area of a transistor substrate comprising a driving element, and having a display area, and the non-display area surrounding the display area;
- removing a portion of the first bank layer to form a second bank layer spaced apart from the display area and to define a trench;
- forming a first inorganic insulating layer on the first bank layer, on the second bank layer, and on portions of the first bank layer and the second bank layer defining the trench;
- forming a low refractive layer on the first inorganic insulating layer to overlap at least another portion of the first bank layer;
- forming a first color filter layer on the first inorganic insulating layer and filling the trench; and
- cutting between the first bank layer and the second bank layer.

18. The method of claim 17, further comprising:
- forming a second color filter layer on the first color filter layer; and
- forming a third color filter layer on the second color filter layer.

19. The method of claim 17, further comprising:
- locating a light emitting element on and connected to the driving element;
- locating a color converting layer on the light emitting element to overlap the light emitting element;
- locating a second color filter layer on the color converting layer; and
- locating a third color filter layer above the first color filter layer,
- wherein the second color filter layer is deposited concurrently with one of the first or third color filter layers.

20. The method of claim 17, wherein the first color filter layer is exposed to an outside.

\* \* \* \* \*